United States Patent
Aida et al.

(10) Patent No.: US 11,512,171 B2
(45) Date of Patent: Nov. 29, 2022

(54) LOW DIELECTRIC CONSTANT SILICEOUS FILM MANUFACTURING COMPOSITION AND METHODS FOR PRODUCING CURED FILM AND ELECTRONIC DEVICE USING THE SAME

(71) Applicant: Merck Patent GmbH, Darmstadt (DE)

(72) Inventors: Kensuke Aida, Kakegawa (JP); Kazuya Arima, Kakegawa (JP); Issei Sakurai, Kakegawa (JP)

(73) Assignee: MERCK PATENT GMBH, Darmstadt (DE)

(*) Notice: Subject to any disclaimer, the term of this patent is extended or adjusted under 35 U.S.C. 154(b) by 0 days.

(21) Appl. No.: 17/633,234

(22) PCT Filed: Aug. 6, 2020

(86) PCT No.: PCT/EP2020/072072
§ 371 (c)(1),
(2) Date: Feb. 7, 2022

(87) PCT Pub. No.: WO2021/028297
PCT Pub. Date: Feb. 18, 2021

(65) Prior Publication Data
US 2022/0267532 A1   Aug. 25, 2022

(30) Foreign Application Priority Data

Aug. 9, 2019 (EP) .................................. 19191135

(51) Int. Cl.
*C08G 77/18* (2006.01)
*C08J 9/14* (2006.01)
(52) U.S. Cl.
CPC .............. *C08G 77/18* (2013.01); *C08J 9/142* (2013.01); *C08J 2203/12* (2013.01); *C08J 2383/06* (2013.01)

(58) Field of Classification Search
CPC .......... C09D 183/04; C07F 7/18; C07F 7/025; C08G 77/50; H01L 21/31; H01L 21/31695
See application file for complete search history.

(56) References Cited

U.S. PATENT DOCUMENTS

| | | | |
|---|---|---|---|
| 7,205,030 B2 | 4/2007 | Misawa et al. | |
| 2005/0106376 A1* | 5/2005 | Leung | H01L 21/02126 427/372.2 |
| 2007/0100109 A1 | 5/2007 | Hacker et al. | |

FOREIGN PATENT DOCUMENTS

| | | |
|---|---|---|
| EP | 1197998 A2 | 4/2002 |
| EP | 1354980 B1 | 10/2003 |

OTHER PUBLICATIONS

International Search Report and Written Opinion received for PCT Patent Application No. PCT/EP2020/072072, dated Nov. 2, 2020, 7 pages.

* cited by examiner

*Primary Examiner* — Kuo Liang Peng
(74) *Attorney, Agent, or Firm* — Faegre Drinker Biddle & Reath LLP

(57) ABSTRACT

To provide a low dielectric constant siliceous film manufacturing composition capable of forming a low dielectric constant siliceous film with dispersed pores having excellent mechanical properties and stable electrical properties. [Means] The present invention provides a low dielectric constant siliceous film manufacturing composition comprising: a polysiloxane, a pore-generating material, a condensation catalyst generator, and a solvent.

22 Claims, No Drawings

LOW DIELECTRIC CONSTANT SILICEOUS FILM MANUFACTURING COMPOSITION AND METHODS FOR PRODUCING CURED FILM AND ELECTRONIC DEVICE USING THE SAME

CROSS-REFERENCE TO RELATED APPLICATIONS

This application is a national stage application (under 35 U.S.C. § 371) of PCT/EP2020/072072, filed Aug. 6, 2020, which claims benefit of European Application No. 19191135.3, filed Aug. 9, 2019, both of which are incorporated herein by reference in their entirety.

BACKGROUND OF THE INVENTION

Technical Field

The present invention relates to a low dielectric constant siliceous film manufacturing composition. Further, this invention also relates to methods for producing a cured film and an electronic device using the same.

Background Art

There is a continuing desire in the electronics industry to increase the circuit density in electronic components without degrading electrical performance because of the recent progress of high integration, multifunction and high performance in semiconductor integrated circuits. It is desirable to increase the speed of signal propagation in these components. One method of accomplishing these goals is to reduce the parasitic capacitance of the components by using reduced dielectric constant insulating material in the interlayer or intermetal layer of the components. A method for reducing the dielectric constant of such interlayer dielectrics or intermetal dielectrics is to incorporate very small uniformly dispersed pores within the insulating film.

In addition, the reduced dielectric constant dielectrics is required to have thermal stabilities, resistance to crack generation and propagation, low water uptake, chemical resistance, capacity for planarization, processability by photolithographic techniques and gas phase etching procedure, adhesion to a substrate, and mechanical properties high enough to withstand chemical mechanical polishing (CMP) process.

Porous dielectric materials are well-known in the art. One known process of making a porous dielectric involves copolymerization of a thermally liable monomer and a dielectric monomer to form a block copolymer, followed by heating to decompose the thermally liable monomer unit. US 2007/0100109 A1 disclosed a polymer composition comprised a plurality of monomers wherein at least one monomer comprised a radical precursor chemically bonded to a structural precursor. The suitable structural precursor was an organohydridosiloxane and the preferable radical precursors were alkyl groups.

U.S. Pat. No. 7,205,030 B2 disclosed a film-forming composition containing a polysiloxane, a pore-forming agent, an onium salt, and a solvent for forming a porous film. The pore-forming agent was vaporized by heat-treatment.

EP 1 354 980 B1 disclosed a low dielectric constant layers produced by a chemical vapor deposition (CVD) method. A composition suitable for the production of a porous organo-silica film was comprising at least one alkoxysilane and at least one cyclic hydrocarbon as a porogen. A film derived from the composition by CVD method was heat-treated at ambient to 500° C. to remove the porogen.

SUMMARY OF THE INVENTION

One embodiment of the present invention provides a low dielectric constant siliceous film manufacturing composition that can fill a narrow and a high aspect ratio trench and can produce a film with excellent planarity.

Another embodiment of the present invention provides a method of manufacturing a low dielectric constant siliceous film with dispersed pores having mechanical properties high enough to withstand CMP process and stable electrical properties due to low water uptake.

Yet another embodiment of the present invention provides a method of manufacturing an electronic device having a low dielectric constant siliceous film with dispersed pores.

One embodiment of the present invention provides a low dielectric constant siliceous film manufacturing composition that comprises, (I) a polysiloxane, (II) a pore-generating material, (III) a condensation catalyst generator, and (IV) a solvent.

The polysiloxane (I) according to the present invention comprises a repeating unit represented by the following formula (Ia):

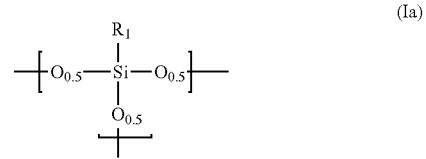

wherein $R^1$ is hydrogen, a monovalent to trivalent, linear, branched or cyclic, saturated or unsaturated $C_{1\text{-}30}$ aliphatic hydrocarbon group, or a monovalent to trivalent $C_{6\text{-}30}$ aromatic hydrocarbon group, in said aliphatic hydrocarbon group and said aromatic hydrocarbon group, one or more methylene is unsubstituted or substituted with oxy, imide or carbonyl, one or more hydrogens are unsubstituted or substituted with fluorine, hydroxy or alkoxy, or one or more carbons are unsubstituted or substituted with silicon, when $R^1$ is divalent or trivalent, $R^1$ connects Si atoms contained in a plurality of repeating units; and a repeating unit represented by the following formula (Ib):

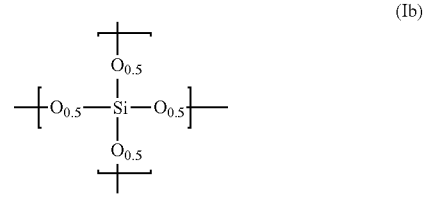

and further (I) the polysiloxane shows a spectrum in which the area intensities S1 and S2 of the peaks in the ranges of 1100±100 cm$^{-1}$ and 900±100 cm$^{-1}$ assigned to Si—O and SiOH, respectively, are in a S2/S1 ratio of 0.05 to 0.15 when measured and analyzed by fourier transform infrared spectroscopy (FT-IR).

The condensation catalyst generator (II) is a thermal base generator capable of generating a base by heat-treatment and/or a photobase generator capable of generating a base by photo-irradiation.

The pore-generating material (III) is a substituted or an unsubstituted polycyclic hydrocarbon.

The solvent (IV) has an ability to dissolve the components described above.

Another embodiment of the present invention provides a method of manufacturing a low dielectric constant siliceous film with dispersed pores that includes applying the above-described low dielectric constant siliceous film manufacturing composition on a substrate to form a coating; curing the coating under a nitrogen atmosphere.

Yet another embodiment of the present invention provides a method of manufacturing an electronic device having a low dielectric constant siliceous film with dispersed pores manufactured by a method comprising: applying the above-described low dielectric constant siliceous film manufacturing composition on a substrate to form a coating; curing the coating at 250° C. or less.

The low dielectric constant siliceous film manufacturing composition of the present invention is able to fill a narrow and a high aspect ratio trench and to form a coating with planarity. Further, the resultant low dielectric constant siliceous film with dispersed pores also has mechanical properties high enough to withstand CMP process and its electrical properties is stable due to low water uptake. It is possible to improve the yield and performance of electronic devices by using this composition.

Definitions

Unless otherwise stated, the following terms used in the specification and claims shall have the following meanings for the purpose of the present specification.

In the present specification, the use of the singular includes the plural, and the words "a", "an" and "the" mean "at least one", unless specifically stated otherwise. Furthermore, the use of the term "including", as well as other forms such as "includes" and "included", is not limiting. Also, terms such as "element" or "component" encompass both elements or components comprising one unit and elements or components that comprise more than one unit, unless specifically stated otherwise. As used herein, the conjunction "and" is intended to be inclusive and the conjunction "or" is not intended to be exclusive, unless otherwise indicated. For example, the phrase "or, alternatively" is intended to be exclusive. As used herein, the term "and/or" refers to any combination of the foregoing elements including using a single element.

The term "about" or "approximately," when used in connection with a measurable numerical variable, refers to the indicated value of the variable and to all values of the variable that are within the experimental error of the indicated value (e.g., within the 95% confidence limit for the mean) or within ±10 percent of the indicated value, whichever is greater.

In the present specification, the descriptions such as "$C_{x-y}$", "$C_x$-$C_y$" and "$C_x$" mean the number of carbon atoms in a molecule or substituent. For example, $C_{1-6}$ alkyl means alkyl having not less than 1 and not more than 6 carbons (methyl, ethyl, propyl, butyl, pentyl, hexyl etc.).

In the present specification, unless otherwise specifically mentioned, "alkyl" means a linear or branched alkyl, and "cycloalkyl" means alkyl containing a cyclic structure. Those in which a cyclic structure is substituted with a linear or branched alkyl are also referred to as cycloalkyl. Further, those having a polycyclic structure such as bicycloalkyl are also included in cycloalkyl. "Heteroalkyl" means alkyl containing oxygen or nitrogen in the main chain or side chain unless otherwise specifically mentioned and means, for example, alkyl including oxy, hydroxy, amino, carbonyl and the like. Further, "hydrocarbyl group" means a monovalent, divalent or higher group comprising carbon and hydrogen and optionally containing oxygen or nitrogen. Furthermore, in the present specification, unless otherwise specifically mentioned, "alkylene" means a divalent group corresponding to said alkyl and includes, for example, a linear alkylene or a branched alkylene having a side chain.

In the case of numerical range is described with "to", "-" or "~", these include end points and units are common. For example, 5-25 mol % refers to that 5 mol % or more and 25 mol % or less.

In the present specification, in the case polymer comprises plural kinds of repeating units without any specific definitions, these repeating units copolymerize. These copolymerizations can take alternating copolymerization, random copolymerization, block copolymerization, graft copolymerization, or any mixture of thereof.

In the present specification, unless otherwise specifically mentioned, Celsius is used as the temperature unit. For example, 20 degrees means 20 degrees Celsius.

In the present specification, unless otherwise specifically mentioned, "%" means "% by mass" and "parts" means "parts by mass".

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literatures and similar materials defines a term in a manner that contradicts the definition of that term in this application, this application controls.

DETAILED DESCRIPTION OF THE INVENTION

Embodiments of the present invention are described in detail below.

[Low Dielectric Constant Siliceous Film Manufacturing Composition]

The low dielectric constant siliceous film manufacturing composition according to the present invention comprises:

(I) a polysiloxane, (II) a pore-generating material, (III) a condensation catalyst generator, and (IV) a solvent.

These components are respectively described below.

[(I) Polysiloxane]

The polysiloxane refers to a polymer having a main chain of Si—O—Si bond (siloxane bond). In the present specification, the polysiloxane shall also include a silsesquioxane polymer represented by the general formula $(RSiO_{1.5})_n$.

The polysiloxane according to the present invention comprises two types of repeating units represented by specific formulas. The first repeating unit is represented by the following formula (Ia):

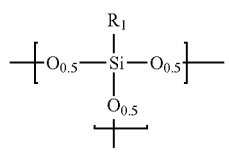

In the above formula, $R^1$ is hydrogen, a monovalent to trivalent, linear, branched or cyclic, saturated or unsaturated $C_{1-30}$ aliphatic hydrocarbon group, or a monovalent to trivalent $C_{6-30}$ aromatic hydrocarbon group. In the aliphatic hydrocarbon group and the aromatic hydrocarbon group, one or more methylene is unsubstituted or substituted with oxy, imide or carbonyl, one or more hydrogens are unsubstituted or substituted with fluorine, hydroxy or alkoxy, or one or more carbons are unsubstituted or substituted with silicon. When $R^1$ is divalent or trivalent, $R^1$ connects to other Si atoms contained in a plurality of repeating units.

When $R^1$ is a monovalent group, $R^1$ is preferably hydrogen, linear, branched or cyclic $C_{1-6}$ alkyl or $C_{6-10}$ aryl. Examples thereof include: (i) hydrogen; (ii) alkyl, such as, methyl, ethyl, propyl, butyl, pentyl, hexyl, heptyl, octyl, or decyl; (iii) cycloalkyl, such as, cyclohexyl; (iv) aryl, such as, phenyl, tolyl, or benzyl; (v) fluoroalkyl, such as, trifluoromethyl, 2,2,2-trifluoroethyl, or 3,3,3-trifluoropropyl; (vi) fluoroaryl; and (vii) nitrogen-containing group having an amino or imido structure, such as, glycidyl, isocyanate or amino. Preferred are (ii) alkyl and (iv) aryl, and particularly preferred are methyl and phenyl.

When $R^1$ is a divalent or trivalent group, $R^1$ preferably contains alkylene, arylene, cycloalkylene ring, piperidine ring, pyrrolidine ring, isocyanurate ring and the like.

The second repeating unit is represented by the following formula (Ib):

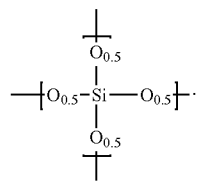

Specifically, the polysiloxane preferably comprises repeating units selected from the group consisting of (i-1), (i-2) and (i-3) in combination:

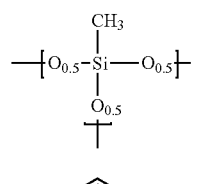

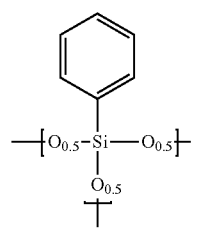

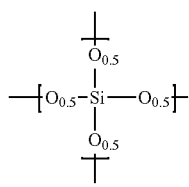

provided that the mixing molar ratios p1, p2 and p3 of (i-1), (i-2) and (i-3), respectively, satisfy the conditions of:

$0.4 \leq p1/(p1+p2+p3) \leq 0.8$, $0 \leq p2/(p1+p2+p3) \leq 0.4$, and $0.2 \leq p3/(p1+p2+p3) \leq 0.6$.

If this polysiloxane is employed, it is possible to obtain a low dielectric constant siliceous film remarkably improved in mechanical properties high enough to withstand CMP process. The smaller the molar ratio P2 is, the more the mechanical properties tends to be improved. Accordingly, in view of mechanical properties, the molar ratio P2 is preferably equal to 0 (i.e., p2=0).

The polysiloxane according to the present invention can further comprise the repeating unit represented by the following formula (Ic):

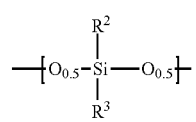

wherein
$R^2$ and $R^3$ are independently hydrogen, linear, branched or cyclic $C_{1-6}$ aliphatic hydrocarbon group or $C_{6-10}$ aromatic hydrocarbon group. In view of mechanical properties of a derived low dielectric constant siliceous film, the molar ratio of the repeating unit (Ic) is preferably 15 mol % or less based on the total amount of the repeating units.

The polysiloxane according to the present invention can still further comprise a terminal unit represented by the following formula (Id):

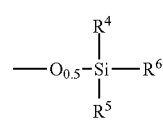

wherein
$R^4$ to $R^6$ are independently hydrogen, linear, branched or cyclic $C_{1-6}$ aliphatic hydrocarbon group or $C_{6-10}$ aromatic hydrocarbon group. In view of mass average molecular weight of the polysiloxane, the molar ratio of the terminal unit (Id) is preferably 2 mol % or less based on the total amount of the repeating units.

A polysiloxane molecule can have a hydroxyl and/or alkoxyl at the terminal or in the side chain according to a synthesis condition but a hydroxyl is preferable for the present invention. The polysiloxane adopted in the present invention is characterized not only by the types of repeating units constituting the molecule thereof but also by the amount of silanol groups (SiOH) contained therein. The amount of silanol groups depends on synthesis conditions of polysiloxane, such as, mixing ratios of monomers and kinds of reaction catalysts. The silanol content can be quantitatively determined by FT-IR. In the FT-IR spectrum, the absorption band assigned to silanol (SiOH) has a peak in the range of 900±100 cm$^{-1}$. Accordingly, if a large amount of silanol groups are contained, that absorption band has high intensity.

In the present invention, the intensity of the absorption band assigned to Si—O is used as a reference for quantitatively evaluating the silanol content. Specifically, the absorption band having a peak in the range of 1100±100 cm$^{-1}$ is adopted as the peak assigned to Si—O. The area intensities S1 and S2 of the absorption bands assigned to Si—O and SiOH, respectively, are measured to calculate the S2/S1 ratio, and thereby the silanol content is relatively evaluated. In consideration of storage stability of the low dielectric constant siliceous film manufacturing composition, the S2/S1 ratio is preferably a small value. The S2/S1 ratio is 0.05 to 0.15, preferably 0.06 to 0.13 in the present invention.

Such a polysiloxane can be obtained through hydrolysis and condensation, optionally in the presence of an acidic catalyst or a basic catalyst, of silane compounds represented by the following formulas (ia) and (ib), and optionally (ic) and (id):

  (ia)

  (ib)

  (ic)

  (id)

wherein
p is an integer of 1 to 3,
R$^{1'}$ is hydrogen, a monovalent to trivalent, linear, branched or cyclic, saturated or unsaturated C$_{1-30}$ aliphatic hydrocarbon group, or a monovalent to trivalent, C$_{6-30}$ aromatic hydrocarbon group,
in said aliphatic hydrocarbon group and said aromatic hydrocarbon group, one or more methylene is unsubstituted or substituted with oxy, imide or carbonyl, one or more hydrogens are unsubstituted or substituted with fluorine, hydroxy or alkoxy, or one or more carbons are unsubstituted or substituted with silicon, and
R$^{2'}$ to R$^{6'}$ are independently hydrogen, linear, branched or cyclic C$_{1-6}$ aliphatic hydrocarbon group or C$_{6-10}$ aromatic hydrocarbon group.
R$^7$ to R$^{10}$ are independently C$_{1-10}$ alkyl.

Each of the silane compounds (ia), (ib), (ic) and (id) can be used in combination of two or more kinds.

In the process for producing the polysiloxane, the blending ratio of the silane compound (ib) to the total molar amount of the silane compounds can be changed to control the mixing ratio of the repeating units in the polysiloxane and to control the above S2/S1 ratio. In view of mechanical properties, the polysiloxane in the present invention contains the repeating unit (Ib) in a mixing ratio of preferably 10 mol % or more based on the total amount of the repeating units. However, in order to avoid precipitation of the silane compounds, the mixing ratio of the repeating unit (Ib) is preferably 80 mol % or less, more preferably 75 mol % or less.

The mass average molecular weight of the polysiloxane is usually 1,000 to 12,000, and preferably 1,000 to 10,000 from the viewpoint of solubility in an organic solvent. The mass average molecular weight in terms of polystyrene can be measured by gel permeation chromatography.

[(II) Pore-Generating Material]

The pore-generating material is thermally degradable or sublimable which, upon heating to the material's decomposition or sublimation temperature, decomposes or sublimes quantitatively into non-reactive species that can readily diffuse through the polysiloxane matrix. The temperature at which decomposition or sublimation occurs should be sufficiently high to permit standard film preparation and solvent removal. Pore-generating materials thus have a decomposition or sublimation temperature that is at least 120° C., preferably 150° C.

Suitable pore-generating materials are generally sublimable compounds, including substituted or unsubstituted polycyclic hydrocarbons. The polycyclic hydrocarbons are compounds having two or more condensed hydrocarbon rings. Examples of polycyclic hydrocarbons include aliphatic polycyclic hydrocarbons, which are aliphatic bicyclic compounds, aliphatic tricyclic compounds and aliphatic hexacyclic compounds, and aromatic polycyclic hydrocarbons.

Specific examples of the aliphatic bicyclic compounds are norbornane derivatives, such as camphene, isocamphane, α-fenchene, camphene, isoborneol, fenchol, isobornyl acetate, camphor, camphor oxime, nitrocamphor, aminocamphor, camphorquinone, 3-(hydroxymethylene)camphor, 10-camphorsulfonic acid, fenchone, isobornyl cyclohexanol, and santalol.

Examples of the aliphatic tricyclic compounds include adamantane derivatives represented by formula (IIa).

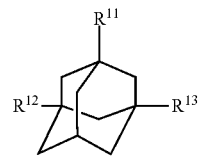  (IIa)

In the formula, R$^{11}$ to R$^{13}$ in each independently represent a hydrogen atom, hydroxyl, C$_{1-6}$ alkyl, carboxyl, acetoxyl, acryloyloxyl, (meth)acryloyloxyl, or acetamido.

Specific examples of the adamantane derivatives are not limited but include 1-hydroxyadamantane, 1,3-dihydroxyadamantane, 1,3,5-adamantanetriol, 3-hydroxy-1-adamantane carboxylic acid, 5-hydroxy-1,3-adamantane dicarboxylic acid, 1,3-dicarboxyadamantane, 1-adamantaneacetic acid, 1,3-adamantanediacetic acid, 3-hydroxy-1-methacryloyloxyadamantane, 1-acryloyloxy-3-hydroxyadamantane, 3,5-dihydroxy-1-methacryloyloxyadamantane, and 1-acetamidoadamantane.

Specific examples of the aliphatic hexacyclic compounds are cubane derivatives, such as methylcubane, cubanecarboxylic acid, methoxycubane, 1,4-dimethoxycubane, dimethyl cubane-1,4-dicarboxylate, cubane-1,4-dicarboxylic acid, 4-methoxycarbonylcubanecarboxylic acid, 1,4-diaminocubane, octaphenylcubane, octamethylcubane, hydroxycubane, 1,4-bishydroxycubane and cubane.

Specific examples of the aromatic polycyclic hydrocarbons include anthracene derivatives, such as anthracene, 9-anthracenecarboxylic acid methyl ester, 9-anthracenecarboxylic acid ethyl ester, 9-anthracenecarboxylic acid phenyl ester, 9-anthracenecarboxylic acid, 1-anthracenecarboxylic acid methyl ester, 1-anthracenecarboxylic acid ethyl ester, 1-anthracenecarboxylic acid phenyl ester, 1-anthracenecarboxylic acid, 9-anthracenecarbaldehyde, 9,10-anthracenedicarbonitrile, 9-anthracenemethanol, 9,10-dihydroxyanthracene, 2,6-dihydroxyanthracene, 1,2-bis(acryloyloxy)anthracene, 1-methylanthracene, 9-methylanthracene, 9-(methylaminomethyl)anthracene, 2-methoxyanthracene, 9-methoxyanthracene, 1,4-diamino-2-methoxyanthracene, 9,10-bis(4-methoxyphenyl)anthracene; phenanthrene derivatives, such as phenanthrene, 1-phenanthrene carboxylic acid, 3-phenanthrene carboxylic acid, 4,5-phenanthrene dicarboxylic acid, 1-hydroxyphenanthrene, 4-hydroxyphenanthrene, 1-methylphenanthrene, 3-methylphenanthrene, 9-methylphenanthrene, 2-methoxyphenanthrene, 3-Methoxyphenanthrene, 7-methoxy-1-methylphenanthrene, 4-methoxyphenanthrene-2,3,6,7-tetrol; triphenylene derivatives, such as triphenylene, 1-methyltriphenylene, 2-methyltriphenylene, 2-methoxytriphenylene, 2,3,6,7,10,11-hexahydroxytriphenylene, 2,3,6,7,10,11-hexamethoxytriphenylene, 2,3,6,7,10,11-hexaacetoxytriphenylene, 2-tolyltriphenylene and 2,3,6,7,10,11-hexatolyltriphenylene.

The amount of the pore-generating material depends on the film properties derived from the low dielectric constant siliceous film manufacturing composition. The amount is preferably 50 to 200 mass %, more preferably 80 to 180 mass %, based on the mass of the polysiloxane. From the viewpoint of lowering dielectric constant of the derived film, the pore-generating material is preferably incorporated in a large amount. On the other hand, from the viewpoint of avoiding scratches at CMP process of the derived film, the amount thereof is preferably small.

[(III) Condensation Catalyst Generator]

A condensation catalyst generator according to the present invention will not perform catalytic activity in the composition but generates catalyst in a formed coating. The condensation catalyst generator comprising in the composition of the present invention refers to a thermal base generator (TBG), which generates base by heat-treatment, or a photobase generator (PBG), which generates base by photo-irradiation.

A thermal base generator of the present invention is a compound which generates base by bond cleavage or dissociation of salt during heating. The thermal base generator is preferably generating no or small amount of base from a coating of the low dielectric constant siliceous film manufacturing composition at prebake process.

Examples of the thermal base generator of the present invention, which generate base by bond cleavage, are not limited but include carbamate derivatives such as 1-methyl-1-(4-biphenylyl)ethylcarbamate and 1,1-dimethyl-2-cyanoethylcarbamate; urea derivatives such as urea and N,N-dimethyl-N'-methylurea; dihydropyridine derivatives such as 1,4-dihydronicotinamide.

Examples of the thermal base generator of the present invention, which generate base by dissociation of salt, are not limited but include ammonium salts. The ammonium salt is a salt of an ammonium cation represented by formula (IIIa) or (IIIb) with an anion.

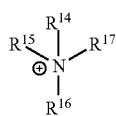

(IIIa)

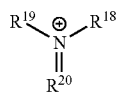

(IIIb)

In the formula, $R^{14}$ to $R^{19}$ in each independently represent a hydrogen atom or a hydrocarbyl group, and $R^{20}$ represents a hydrocarbyl group. $R^{14}$ and $R^{15}$, $R^{16}$ and $R^{17}$, $R^{18}$ and $R^{19}$, and $R^{18}$ and $R^{20}$ can be bonded to each other to form a ring.

A preferable thermal base generator is a compound which generates a tertiary amine or a quaternary ammonium compound or a cycloamidine compound by dissociation of salt. Examples of generating base are not limited but include N-(2-nitrobenzyloxycarbonyl)imidazole, N-(3-nitrobenzyloxycarbonyl)imidazole, N-(4-nitrobenzyloxycarbonyl)imidazole, N-(5-methyl-2-nitrobenzyloxycarbonyl)imidazole, N-(4-chloro-2-nitrobenzyloxycarbonyl)imidazole, 1,8-diazabicyclo[5.4.0]undecene-7,1,5-diazabicyclo[4.3.0]nonene-5,1,5-diazabicyclo[4.4.0]decene-5, tetramethylammonium, tetraethylammonium, tetrapropylammonium, tetrabutylammonium, benzyltrimethylammonium, trimethylhydroxyethylammonium, triethylamine, tripropylamine, triisobutylamine, triisopentylamine, N,N-dimethylpropylamine, N,N-dimethylbutylamine, N,N-diethylmethylamine, and N-methyldiallylamine.

Examples of the anion of the ammonium salt are not limited but include a carboxylic acid anion such as trichloroacetic acid anion, octylic acid anion, phenylpropiolic acid anion, oxalic acid anion, maleic acid anion, fumaric acid anion, malonic acid anion, succinic acid anion and glutaric acid anion; a sulfonic acid anion such as benzenesulfonic acid anion, p-dodecylbenzenesulfonic acid anion, 1,4-naphthalenedisulfonic acid anion, p-toluenesulfonic acid anion and methane sulfonic acid anion; an organoboronic acid anion such as tetraphenylborate anion, tetrabutylborate anion, triphenylbutylborate anion, triphenylhexylborate anion, butyl-tri(p-tolyl)phenyl borate anion, tetrakis(4-fluorophenyl) borate anion and dibutyldiphenylborate anion.

Specific examples of the ammonium salt include 1,8-diazabicyclo[5.4.0]undec-7-ene tetraphenylborate, 1,8-diazabicyclo[5.4.0]undec-7-ene triphenylbutylborate, 1,8-diazabicyclo[5.4.0]undec-7-ene tetrabutylborate, 1,8-diazabicyclo[5.4.0]undec-7-ene fumaric acid salt, 1,5-diazabicyclo-[4.3.0]non-5-ene tetraphenylborate, 1,5-diazabicyclo-[4.3.0]non-5-ene triphenylbutylborate, 1,5-diazabicyclo-[4.3.0]non-5-ene tetrabutylborate, 1,5-diazabicyclo-[4.3.0]non-5-ene fumaric acid salt, 1,5-diazabicyclo[4.4.0]decene-5-ene tetraphenylborate, 1,5-diazabicyclo[4.4.0]decene-5-ene triphenylbutylborate, 1,5-diazabicyclo[4.4.0]decene-5-ene tetrabutylborate, 1,5-diazabicyclo[4.4.0]decene-5-ene fumaric acid salt, 2-Ethyl-4-methyl imidazolium tetraphenylborate, 2-Ethyl-4-methyl imidazolium triphenylbutylborate, 2-Ethyl-4-methyl imidazolium tetrabutylborate, 2-Ethyl-4-methyl imidazolium fumaric acid salt, N-(2-nitrobenzyloxycarbonyl)imidazolium triphenylbutylborate, N-(2-nitrobenzyloxycarbonyl)imidazolium tetraphenylborate, N-(2-nitrobenzyloxycarbonyl)imidazolium tetrabutylborate, and N-(2-nitrobenzyloxycarbonyl)imidazolium fumaric acid salt.

A suitable base generating temperature of the thermal base generator is at lower temperature than decomposition or sublimation temperature of the pore-generating materials, which is preferably 40-200° C., more preferably 80-180° C.

Examples of the photobase generator include a polysubstituted amide compound having an amide, and a lactam or imide compound, or a compound containing a structure thereof.

Further, preferable examples of the photobase generator include a photobase generator represented by the following general formula (IIIc).

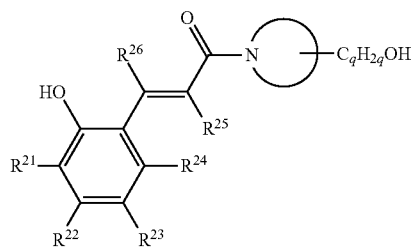

(IIIc)

wherein, q is an integer of 1 to 6;

$R^{21}$ to $R^{26}$ are each independently hydrogen, halogen, hydroxyl, mercapto, sulfide, silyl, silanol, nitro, nitroso, sulfino, sulfo, sulfonate, phosphino, phosphinyl, phosphono, phosphonate, amino, ammonium, $C_{1-20}$ aliphatic hydrocarbyl, which may contain a substituent, $C_{6-22}$ aromatic hydrocarbyl, which may contain a substituent, $C_{1-20}$ alkoxy, which may contain a substituent, or $C_{6-20}$ aryloxy, which may contain a substituent; and two or more of $R^{17}$ to $R^{20}$ may be bonded to form cyclic structure(s), said cyclic structure may contain hetero atom(s), N is a constituent atom of a nitrogen-containing heterocyclic ring, said nitrogen-containing heterocyclic ring is a 3- to 10-membered ring, and said nitrogen-containing heterocyclic ring may further have $C_{1-20}$ aliphatic hydrocarbyl, which are different from $C_qH_{2q}OH$ group and may contain substituent(s).

It is preferred that $R^{21}$ to $R^{24}$ are selected appropriately according to the exposure wavelength to be used. For example, unsaturated hydrocarbon bonding functional groups such as a vinyl and an alkynyl, which shift the absorption wavelength to g-, h-, i-lines, as well as an alkoxy, a nitro and the like are used, and a methoxy and an ethoxy are particularly preferable.

Specific examples of the compound represented by the formula (IIIc) include the following.

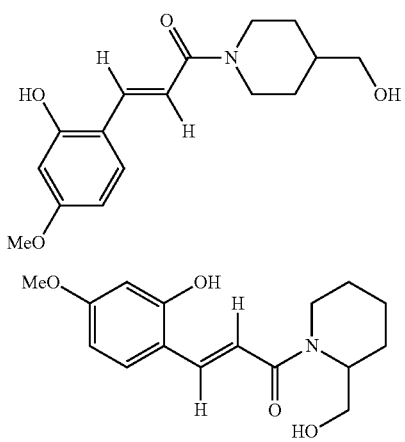

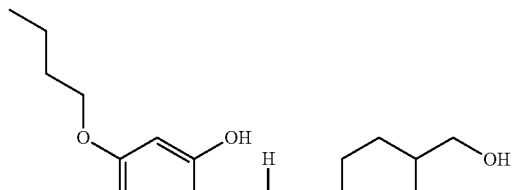

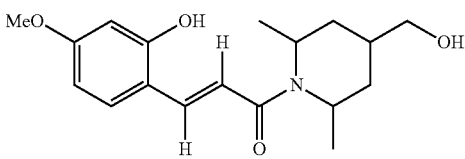

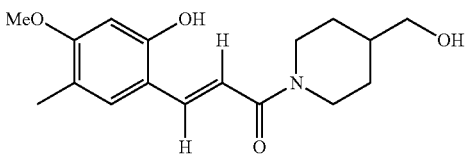

The condensation catalyst generator according to the present invention can be used solely or as a mixture of two or more compounds.

The amount of the condensation catalyst generator depends on the kind of the active substance released by decomposition or dissociation thereof, on the amount of the released substance. The amount is preferably 0.1 to 5.0 mass %, more preferably 0.5 to 3.0 mass %, based on the mass of the polysiloxane. From the viewpoint of promoting condensation of the polysiloxane, the condensation catalyst generator is preferably incorporated in a large amount. On the other hand, from the viewpoint of avoiding cracks of the derived film, the amount thereof is preferably small.

[(IV) Solvent]

The composition according to the present invention comprises a solvent. This solvent is selected from those which uniformly dissolve or disperse each component contained in the composition and is generally an organic solvent. Specific examples of the solvent include ethylene glycol monoalkyl ethers such as ethylene glycol monomethyl ether, ethylene glycol monoethyl ether, ethylene glycol monopropyl ether and ethylene glycol monobutyl ether; diethylene glycol dialkyl ethers such as diethylene glycol dimethyl ether, diethylene glycol diethyl ether, diethylene glycol dipropyl ether and diethylene glycol dibutyl ether; ethylene glycol alkyl ether acetates such as methyl cellosolve acetate and ethyl cellosolve acetate; propylene glycol monoalkyl ethers such as propylene glycol monomethyl ether (PGME) and propylene glycol monoethyl ether; propylene glycol alkyl ether acetates such as propylene glycol monoethyl ether acetate (PGMEA), propylene glycol monoethyl ether acetate and propylene glycol monopropyl ether acetate; aromatic hydrocarbons such as benzene, toluene and xylene; ketones such as methyl ethyl ketone, acetone, methyl amyl ketone, methyl isobutyl ketone and cyclohexanone; and alcohols such as isopropanol and propane diol. These solvents are used alone or in combination of two or more kinds.

The mixing ratio of the solvent varies depending on the application method and the demand for the film thickness after coating. For example, in the case of spray coating, the concentration of the solvent is relatively high, but in the case of slit coating, the concentration is lower. The total ratio of the above polysiloxane, pore-generating material, condensation catalyst generator and other optional components described below based on the whole mass of the composition, namely, the solid content is generally 2.0 to 50 mass %, preferably 10 to 40 mass %.

[(V) Optional Component]

In addition, the composition according to the present invention can contain optional components as needed. Examples of such optional components include surfactants. The surfactant can improve coatability. Examples of the surfactant that can be used in the composition of the present invention include nonionic surfactants, anionic surfactants, amphoteric surfactants, and the like.

Examples of the nonionic surfactant include, polyoxyethylene alkyl ethers, such as polyoxyethylene lauryl ether, polyoxyethylene oleyl ether and polyoxyethylene cetyl ether; polyoxyethylene fatty acid diester; polyoxy fatty acid monoester; polyoxyethylene polyoxypropylene block polymer; acetylene alcohol; acetylene glycol; acetylene alcohol derivatives, such as polyethoxylate of acetylene alcohol; acetylene glycol derivatives, such as polyethoxylate of acetylene glycol; fluorine-containing surfactants, such as Fluorad (trade name, manufactured by Sumitomo 3M Limited), Megafac (trade name, manufactured by DIC Corporation), Surflon (trade name, AGC Inc.); or organosiloxane surfactants, such as KP341 (trade name, manufactured by Shin-Etsu Chemical Co., Ltd.). Examples of said acetylene glycol include 3-methyl-1-butyne-3-ol, 3-methyl-1-pentyn-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, 2,5-dimethyl-2,5-hexane-diol and the like.

Further, examples of the anionic surfactant include ammonium salt or organic amine salt of alkyl diphenyl ether disulfonic acid, ammonium salt or organic amine salt of alkyl diphenyl ether sulfonic acid, ammonium salt or organic amine salt of alkyl benzene sulfonic acid, ammonium salt or organic amine salt of polyoxyethylene alkyl ether sulfuric acid, ammonium salt or organic amine salt of alkyl sulfuric acid and the like.

Further, examples of the amphoteric surfactant include 2-alkyl-N-carboxymethyl-N-hydroxyethyl imidazolium betaine, lauric acid amide propyl hydroxysulfone betaine and the like.

These surfactants can be used alone or as a mixture of two or more kinds, and the mixing ratio thereof is usually 50 to 10,000 ppm, preferably 100 to 5,000 ppm, based on the total mass of the low dielectric constant siliceous film manufacturing composition.

<Methods for Producing a Cured Film>

The method for producing a low dielectric constant siliceous film according to the present invention comprises coating the composition according to the present invention on a substrate to form a coating film, optionally photo-irradiation and heating the coating film. The method for forming a low dielectric constant siliceous film is described below in the order of steps.

(1) Coating Step

The shape of the substrate is not particularly limited, and it can be freely selected according to the purpose. However, the composition according to the present invention is characterized by being easily penetrated even into narrow trenches and the like and capable of forming a film with excellent planarity, so that it can be applied to a substrate having trench portions and holes of a high aspect ratio. Specifically, it can be applied to a substrate having at least one trench having a width of the deepest portion of 0.2 μm or less and an aspect ratio of 2 or more. Shape of the trench is not particularly limited, and the cross section thereof can be any of a rectangle, a forward tapered shape, a reverse tapered shape, a curved surface shape, and the like. Both end portions of the trench can be opened or closed.

Typical examples of the substrate having at least one trench of a high aspect ratio include a substrate for an electronic device comprising a transistor element, a bit line, a capacitor, and the like. For the fabrication of such an electronic device, subsequent to a step of forming an insulating film between a transistor element called PMD and a bit line, between a transistor element and a capacitor, between a bit line and a capacitor or between a capacitor and a metal wiring, or an insulating film between a plurality of metal wirings called IMD, or a step of filling an isolation trench, a through hole plating step of forming a hole vertically penetrating the filling material of the fine trench is included in some cases.

Coating can be performed by any method. Specifically, it can be freely selected from dip coating, roll coating, bar coating, brush coating, spray coating, doctor coating, flow coating, spin coating, slit coating, and the like. Moreover, as a substrate on which the composition is coated, suitable substrates, such as a silicon substrate, a glass substrate, a resin film, can be used. Various semiconductor devices and the like can be formed on these substrates, if necessary. If the substrate is a film, gravure coating is also available. A drying step can also be provided separately after coating a film if desired. Further, by repeating the coating step once or twice or more as needed, the film thickness of the coating film formed can be made as desired.

(2) Pre-Baking Step

After forming the coating film of the composition, it is preferable to carry out pre-baking (pre-heating treatment) of the coating film in order to dry the coating film and reduce the residual amount of the solvent. The pre-baking process can be generally carried out at a temperature of 70 to 180° C., preferably 100 to 150° C., in the case of a hot plate, for 10 to 300 seconds, preferably 30 to 180 seconds and in the case of a clean oven, for 1 to 30 minutes.

(3) Photo-Irradiation

Photo-irradiation is conducted when PBG is used as a condensation catalyst generator. The photo-irradiation is carried out prior to curing step. It is possible to adopt any light source used in conventional semiconductor manufacturing processes for the photo-irradiation. Examples of the light source include high-pressure mercury lamp, low-pressure mercury lamp, metal halide lamp, xenon lamp, laser diode and LED. Light for the photo-irradiation is normally UV rays of g-line, h-line, i-line or the like. Energy of the light depends on the light source and the thickness of the coating film, but is generally 5 to 2000 mJ/cm$^2$, preferably 10 to 1000 mJ/cm$^2$.

(4) Curing Step

A low dielectric constant siliceous film with dispersed pores is formed by heating the coating film. In the present invention, the low dielectric constant siliceous film with dispersed pores means one in which the ratio of the number of oxygen atoms to the number of silicon atoms in the film is 1.2 or more. As the heating apparatus to be used in the curing step, the same one used in the above-mentioned pre-baking step can be used. The heating temperature in this curing process is not particularly limited as long as it is a temperature at which the low dielectric constant siliceous film with dispersed pores can be formed, and it can be freely determined. However, if a silanol group remains, chemical resistance of the low dielectric constant siliceous film with dispersed pores can become insufficient or the dielectric constant of the low dielectric constant siliceous film with dispersed pores can become high. From this viewpoint, for the heating temperature, relatively high temperature is generally selected. Specifically, heating is performed at preferably 250° C. or lower, more preferably 220° C. or lower, and particularly preferably 200° C. or lower. On the other hand, in order to accelerate the curing reaction, the heating temperature is preferably 70° C. or higher, more preferably 100° C. or higher, and particularly preferably 110° C. or higher. Further, the heating time is not particularly limited, and is generally determined to be 10 minutes to 24 hours, preferably 30 minutes to 3 hours. This heating time is the time after the temperature of the film reaches a desired heating temperature. Normally, it takes several minutes to several hours until the film reaches a desired temperature from the temperature before heating. The curing step is preferably performed under a nitrogen atmosphere.

<Low Dielectric Constant Siliceous Film and Electronic Device Comprising the Same>

The low dielectric constant siliceous film with dispersed pores according to the present invention can be produced by coating the composition according to the present invention on a substrate and curing. The low dielectric constant siliceous film with dispersed pores formed using the composition according to the present invention can achieve excellent planarity, chemical resistance, tolerance to CMP process, electrical properties, heat resistance and the like. Therefore, it can be suitably used in various fields as an interlayer insulating film for low temperature polysilicon, an intermetal dielectrics, a transparent protective film, and the like.

The film thickness of the low dielectric constant siliceous film with dispersed pores is selected from the application but preferably 100 nm or more in view of tolerance to CMP process.

Method for manufacturing an electronic device of the present invention comprises the above described method. Preferably the device is a semiconductor device, solar cell chip, organic light emitting diode and inorganic light emitting diode. One preferable embodiment of the device of this invention is a semiconductor device.

The present invention is described more specifically below with reference to Examples and Comparative Examples, but the present invention is not limited by these Examples and Comparative Examples.

Synthesis Example 1 (Synthesis of Polysiloxane A)

In a 2 L flask equipped with a stirrer, a thermometer and a condenser, 32.5 g of 40 mass % tetra-n-butylammonium hydroxide (TBAH) aqueous solution and 308 ml of 2-methoxypropanol (PGME) are charged. Then, a mixed solution of 19.6 g of methyltrimethoxysilane and 9.2 g of tetramethoxysilane is prepared in a dropping funnel. The mixed solution is dropped into the flask and stirred at room temperature for 2 hours, and then 500 ml of normal propyl acetate (n-PA) is added, and then 1.1 equivalents of a 3% maleic acid aqueous solution with respect to TBAH is added. The mixture is stirred for neutralization for 1 hour. To the neutralized solution, 500 ml of normal propyl acetate (n-PA) and 250 ml of water are added, the reaction solution is separated into two layers, the obtained organic layer is washed three times with 250 ml of water and concentrated under reduced pressure to remove water and the solvent, and PGME is added for adjustment so as to make the solid content of 7 mass %. When the molecular weight (in terms of polystyrene) of the resulting Polysiloxane A is measured by GPC, the mass average molecular weight (hereinafter sometimes abbreviated as "Mw") is 2,068.

The S2/S1 ratio, in which S1 and S2 are area intensities of FT-IR absorption bands assigned to Si—O and SiOH, respectively, was measured to find S2/S1=0.13.

Synthesis Example 2 (Synthesis of Polysiloxane B)

In a 2 L flask equipped with a stirrer, thermometer, and condenser, 29.1 g of methyltrimethoxysilane, 0.6 g of phenyltrimethoxysilane, 0.4 g of tetramethoxysilane, and 308 ml of 2-methoxypropanol (PGME) are charged and cooled to 0.2° C. Then, 96.6 g of a 37 mass % tetra-n-butylammonium hydroxide (TBAH) methanol solution is dropped into the flask from a dropping funnel and stirred for 2 hours, and then 500 ml of normal propyl acetate (n-PA) is added. The reaction solution is then cooled again to 0.2° C., and after adding 1.1 equivalents of 3% hydrochloric acid aqueous solution with respect to TBAH, the mixture is stirred for neutralization for 1 hour. To the neutralized solution, 1,000 ml of normal propyl acetate (n-PA) and 250 ml of water are added, the reaction solution is separated into two layers, the obtained organic layer is washed three times with 250 cc of water and then concentrated under reduced pressure to remove water and the solvent, and PGME is added for adjustment so as to make the solid content of 7 mass %. The resulting Polysiloxane B has Mw of 1,286. The S2/S1 ratio was 0.06.

Synthesis Example 3 (Synthesis of Polysiloxane C)

In a 2 L flask equipped with a stirrer, a thermometer and a condenser, 2.47 g of dimethyldimethoxysilane, 11.2 g of methyltrimethoxysilane, 15.4 g of tetramethoxysilane, and 308 ml of 2-methoxypropanol (PGME) are charged, and cooled to 0.2° C. Thereafter, 96.6 g of a 37 mass % tetra-n-butylammonium hydroxide (TBAH) methanol solution is dropped into the flask from a dropping funnel and stirred for 2 hours, and then 500 ml of normal propyl acetate (n-PA) is added. The reaction solution is cooled again to 0.2° C., and after adding 1.1 equivalents of 3% hydrochloric acid aqueous solution with respect to TBAH, the mixture is stirred for neutralization for 1 hour. To the neutralized solution, 1,000 ml of normal propyl acetate (n-PA) and 250 ml of water are added, the reaction solution is separated into two layers, the obtained organic layer is washed three times with 250 ml of water and then concentrated under reduced pressure to remove water and the solvent, and PGME is added for adjustment so as to make the solid content of 7 mass %. The resulting Polysiloxane C has Mw of 1,128 and the S2/S1 ratio was 0.08.

Synthesis Example 4 (Synthesis of Polysiloxane D)

In a 2 L flask equipped with a stirrer, a thermometer and a condenser, 32.5 g of 40 mass % tetra-n-butylammonium hydroxide (TBAH) aqueous solution and 308 ml of 2-methoxypropanol (PGME) are charged. Then, a mixed solution of 19.1 g of methyltrimethoxysilane, 0.2 g of methoxytrimethylsilane and 9.2 g of tetramethoxysilane is prepared in a dropping funnel. The mixed solution is dropped into the flask and stirred at room temperature for 2 hours, and then 500 ml of normal propyl acetate (n-PA) is added, and then 1.1 equivalents of a 3% maleic acid aqueous solution with respect to TBAH is added. The mixture is stirred for neutralization for 1 hour. To the neutralized solution, 500 ml of normal propyl acetate (n-PA) and 250 ml of water are added, the reaction solution is separated into two layers, the obtained organic layer is washed three times with 250 ml of water and concentrated under reduced pressure to remove water and the solvent, and PGME is added for adjustment so as to make the solid content of 7 mass %. The resulting Polysiloxane D has Mw of 1,552 and the S2/S1 ratio was 0.10.

Examples 1 to 12 and Comparative Examples 1 to 3

The low dielectric constant siliceous film manufacturing compositions of Examples 1 to 12 and Comparative Examples 1 to 3 are prepared, which comprise polysiloxane, pore-generating material and condensation catalyst generator in the proportions shown in Table 1, with the balance being PGME. In the table, % means mass %.

These low dielectric constant siliceous film manufacturing compositions are applied on a Si wafer by spin coating, and after application, it is prebaked at 120° C. for 2 minutes on a hot plate. Thereafter, curing is performed by heating at 200° C. for 2 hours in a clean oven under a nitrogen atmosphere.

Examples 13 and 14

The low dielectric constant siliceous film manufacturing compositions of Examples 13 and 14 are prepared, which comprise polysiloxane, pore-generating material and condensation catalyst generator in the proportions shown in Table 1, with the balance being PGME. These low dielectric constant siliceous film manufacturing compositions are applied on a Si wafer by spin coating, and after application, it is prebaked at 120° C. for 2 minutes on a hot plate. The coated wafer was subjected to photo-irradiation at 500 mJ/cm$^2$ by i-line exposure machine NSR2205i11D (Nikon Corporation). Thereafter, curing is performed by heating at 200° C. for 2 hours in a clean oven under a nitrogen atmosphere.

With respect to the low dielectric constant siliceous film derived from each prepared composition, refractive index, electrical properties, hardness/modulus, film density, pore size and CMP processability were evaluated in the following manners. The results are shown in Table 2.

[S2/S1 Ratio]

A siloxane solution was dropped onto a silicon wafer, which was successively spin-coated at a rotation speed of 1,000 rpm and then pre-baked on a hot-plate at 120° C. for 60 seconds. FT-IR spectrum was measured at room temperature by FTIR-6100 (JASCO Corporation). In determining the area intensities of the absorption bands, noises and the like in the FT-IR spectrum are taken into account. In the FT-IR spectrum, an absorption band assigned to SiOH has a peak in the range of 900±100 cm$^{-1}$ and one assigned to Si—O has a peak in the range of 1100±100 cm$^{-1}$. The area intensities of those absorption bands are measured as areas based on the baseline that is determined in consideration of noises and the like. The absorption bands assigned to SiOH and Si—O may be overlapped in their tail regions. In that case, the wavenumber at the local minimum point between the peaks is regarded as the boundary. If the band assigned to SiOH or Si—O is overlapped with other band tails, the boundary is determined in the same manner. The area intensities S1 and S2 of the absorption bands assigned to Si—O and SiOH, respectively, are measured by the spectrometer and the S2/S1 ratio was calculated from the measured area intensities.

[Mass Average Molecular Weight]

Gel permeation chromatography (GPC) was measured using Alliance e2695 High Performance GPC system (trade name, manufactured by Nihon Waters K.K.) and Super Multipore HZ-N GPC column (trade name, manufactured by Tosoh Corporation). The measurement was performed using monodispersed polystyrene as a standard sample and tetrahydrofuran as a developing solvent, under the conditions of a flow rate of 0.6 ml/min and a column temperature of 40° C., and thereafter calculating the mass average molecular weight as a relative molecular weight to the standard sample.

[Refractive Index]

A low dielectric constant siliceous film manufacturing composition was coated to a substrate to obtain a film having a thickness of 200 nm. The film was pre-baked in a 50% relative humidity at 120° C. for 3 minutes and subsequently cured under a nitrogen atmosphere at 200° C. for 120 minutes to obtain a low dielectric constant siliceous film with dispersed pores. Refractive index of the obtained film was measured using an ellipsometer M-2000V (J.A. Woollam Co., Inc.).

[Electrical Properties]

Electrical properties of the low dielectric constant siliceous film with dispersed pores with 200 nm film thickness were measured using a mercury probe C-V measurement equipment MCV-530 (Semilab Inc.).

[Hardness/Modulus]

Hardness and modulus of the low dielectric constant siliceous film with dispersed pores with 200 nm film thickness were measured using a nano-indentation tester ENT-2100 (Elonix Inc.).

[Film Density]

Film density of the low dielectric constant siliceous film with 200 nm film thickness were measured by X-ray reflectivity using an X-ray diffractometer Smartlab (Rigaku Co.).

[Pore Size]

Pore size of the low dielectric constant siliceous film with dispersed pores was measured by positoron annihilation lifetime spectroscopy using PALS-2 (Fuji Imvac Inc.).

[CMP Processability]

CMP was conducted on the low dielectric constant siliceous film with dispersed pores with 200 nm film thickness using ceria slurry CES-333F (AGC Inc.) and CMP experimental equipment MAT BC-15C (Kemet Japan Co., Ltd.). Downward pressure of the low dielectric constant siliceous film with dispersed pores against the polishing pad was 100 kPa. Polishing time was 300 sec. The polished low dielectric constant siliceous film with dispersed pores was observed with an optical microscope. The polished low dielectric constant siliceous film with dispersed pores without microscratches was evaluated to have the CMP processability.

TABLE 1

| | | Polysiloxane | | | | Pore-generating material | | Condensation catalyst generator | | |
| | | A | B | C | D | Compound | % based on polysiloxane | TBG | PBG | % based on polysiloxane |
|---|---|---|---|---|---|---|---|---|---|---|
| Example | 1 | 7.00% | — | — | — | 1,3-Dihydroxyadamantane | 50% | 1,5-diazabicyclo-[4.3.0]non-5-ene tetraphenylborate | — | 1% |
| | 2 | 7.00% | — | — | — | 1-Acryloyloxy-3-hydroxy-adamantane | 100% | 1,8-diazabicyclo[5.4.0]undec-7-ene tetraphenylborate | — | 1% |
| | 3 | 7.00% | — | — | — | 3-Hydroxy-1-adamantane carboxylic acid | 100% | 2-Ethyl-4-methyl imidazlium tetraphenylborate | — | 3% |
| | 4 | 7.00% | — | — | — | Dimethyl cubane-1,4-dicarboxylate | 100% | 1,8-diazabicyclo[5.4.0]undec-7-ene fumaric acid salt | — | 5% |
| | 5 | 7.00% | — | — | — | 3-Hydroxy-1-methacryloyl-oxyadamantane | 150% | N-(2-nitrobenzyloxycarbonyl)imidazlium triphenylbutylborate | — | 3% |
| | 6 | 7.00% | — | — | — | 1-Acetamidoadamantane | 200% | 1,5-diazabicyclo [4.4.0]decane-5-ene tetraphenyl borate | — | 5% |
| | 7 | — | 7.00% | — | — | 1,3-Dihydroxyadamantane | 50% | 1,8-diazabicyclo[5.4.0]undec-7-ene triphenylbutylborate | — | 1% |
| | 8 | — | 7.00% | — | — | 3-Hydroxy-1-adamantane carboxylic acid | 150% | 1,5-diazabicyclo-[4.3.0]non-5-ene triphenylbutylborate | — | 3% |
| | 9 | — | — | 7.00% | — | 3,5-Dihydroxy-1-methacryloyloxyadamantane | 100% | 1,5-diazabicyclo-[4.3.0]non-5-ene tetraphenylborate | — | 1% |
| | 10 | — | — | 7.00% | — | 3-Hydroxy-1-methacryloyloxyadamantane | 120% | 2-Ethyl-4-methyl imidazlium triphenylbutylborate | — | 1% |
| | 11 | — | — | 7.00% | — | 1,3-Dihydroxyadamantane | 180% | N-(2-nitrobenzyloxycarbonyl)-imidazlium fumaric acid salt | — | 3% |
| | 12 | — | — | — | 7.00% | 1-Acryloyloxy-3-hydoxy-adamantane | 100% | 1,8-diazabicyclo[5.4.0]undec-7-ene tetraphenylborate | — | 1% |
| | 13 | 7.00% | — | — | — | Camphor | 150% | — | PBG-1 | 1% |
| | 14 | — | 7.00% | — | — | 10-Camphorsulfonic acid | 80% | — | PBG-2 | 1% |
| Comparative Example | 1 | 7.00% | — | — | — | — | 0% | 1,8-diazabicyclo[5.4.0]undec-7-ene tetraphenylborate | — | 1% |
| | 2 | 7.00% | — | — | — | octa-O-acetyl D-(+)Sucrose | 100% | 1,8-diazabicyclo[5.4.0]undec-7-ene tetraphenylborate | — | 1% |
| | 3 | 7.00% | — | — | — | 1-Acryloyloxy-3-hydroxy-adamantane | 250% | 1,8-diazabicyclo[5.4.0]undec-7-ene tetraphenylborate | — | 1% |
| | 4 | — | — | 7.00% | — | 3,5-Dihydroxy-1-methacryloyloxyadamantane | 30% | 1,8-diazabicyclo[5.4.0]undec-7-ene tetraphenylborate | — | 1% |

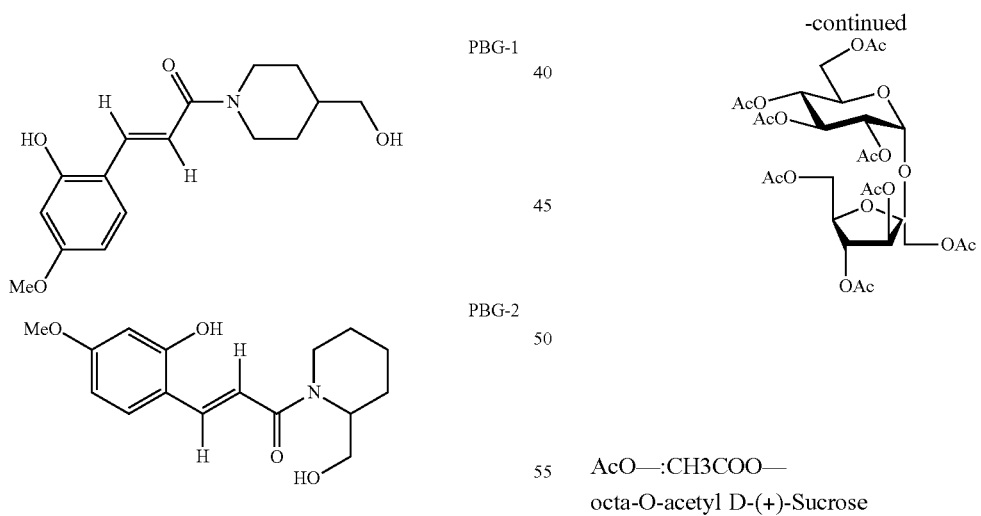

PBG-1

PBG-2

AcO—:CH3COO— octa-O-acetyl D-(+)-Sucrose

TABLE 2

| | | Refractive index | k-value | Electric breakdown field (MV/cm) | Hardness (GPa) | Modulus (Gpa) | Density (g/cm³) | Pore size (nm) | Scratches after CMP |
|---|---|---|---|---|---|---|---|---|---|
| Example | 1 | 1.398 | 2.72 | 4.31 | 0.80 | 14.4 | 1.28 | 0.65 | No |
| | 2 | 1.399 | 2.42 | 4.20 | 0.87 | 13.4 | 1.24 | 0.68 | No |
| | 3 | 1.399 | 2.43 | 4.22 | 0.89 | 14.9 | 1.26 | 0.69 | No |
| | 4 | 1.397 | 2,42 | 4.18 | 0.85 | 13.2 | 1.23 | 0.68 | No |
| | 5 | 1.398 | 2.39 | 4.21 | 0.87 | 13.8 | 1.26 | 0.67 | No |

TABLE 2-continued

|  |  | Refractive index | k-value | Electric breakdown field (MV/cm) | Hardness (GPa) | Modulus (Gpa) | Density (g/cm³) | Pore size (nm) | Scratches after CMP |
|---|---|---|---|---|---|---|---|---|---|
|  | 6 | 1.394 | 2.28 | 4.13 | 0.61 | 11.3 | 1.23 | 0.62 | No |
|  | 7 | 1.397 | 2.85 | 4.34 | 0.76 | 12.9 | 1.24 | 0.69 | No |
|  | 8 | 1.399 | 2.39 | 4.20 | 0.81 | 13.1 | 1.22 | 0.65 | No |
|  | 9 | 1.399 | 2.42 | 4.15 | 0.82 | 14.0 | 1.24 | 0.68 | No |
|  | 10 | 1.397 | 2.35 | 4.18 | 0.80 | 13.8 | 1.23 | 0.66 | No |
|  | 11 | 1.397 | 2.30 | 4.08 | 0.77 | 13.1 | 1.23 | 0.68 | No |
|  | 12 | 1.398 | 2.40 | 4.15 | 0.83 | 13.7 | 1.23 | 0.69 | No |
|  | 13 | 1.399 | 2.37 | 4.20 | 0.87 | 13.5 | 1.24 | 0.68 | No |
|  | 14 | 1.398 | 2.75 | 4.44 | 0.79 | 13.0 | 1.24 | 0.68 | No |
| Comparative Example | 1 | 1.390 | 3.24 | 4.75 | 1.20 | 21.5 | 1.40 | — | No |
|  | 2 | 1.244 | 2.22 | 1.76 | 0.17 | 2.4 | 1.23 | 0.72 | Yes |
|  | 3 | 1.398 | 2.27 | 3.16 | 0.49 | 9.3 | 1.23 | 0.66 | Yes |
|  | 4 | 1.399 | 3.02 | 4.55 | 0.96 | 15.4 | 1.38 | 0.64 | No |

The invention claimed is:

1. A low dielectric constant siliceous film manufacturing composition, comprising:
   (I) a polysiloxane
   which comprises a repeating unit represented by formula (Ia):

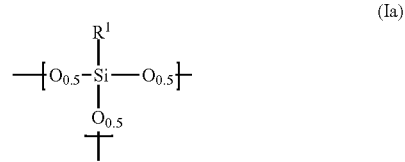

(Ia)

wherein
   $R^1$ is hydrogen, a monovalent to trivalent, linear, branched or cyclic, saturated or unsaturated $C_{1-30}$ aliphatic hydrocarbon group, or a monovalent to trivalent $C_{6-30}$ aromatic hydrocarbon group,
   in said aliphatic hydrocarbon group and said aromatic hydrocarbon group, one or more methylene is unsubstituted or substituted with oxy, imide or carbonyl, one or more hydrogens are unsubstituted or substituted with fluorine, hydroxy or alkoxy, or one or more carbons are unsubstituted or substituted with silicon,
   when $R^1$ is divalent or trivalent, $R^1$ connects Si atoms contained in a plurality of repeating units; and
   a repeating unit represented by formula (Ib):

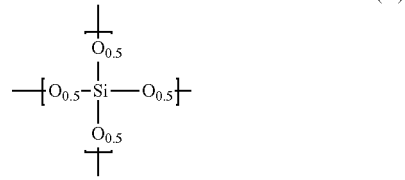

(Ib)

and having a spectrum in which the area intensities S1 and S2 of the peaks in the ranges of $1100 \pm 100$ cm$^{-1}$ and $900 \pm 100$ cm$^{-1}$ assigned to Si—O and SiOH, respectively, are in a S2/S1 ratio of 0.05 to 0.15 when measured and analyzed by FT-IR,
   (II) a pore-generating material,
   (III) a condensation catalyst generator, and
   (IV) a solvent,
   wherein said pore-generating material is a polycyclic hydrocarbon and the polycyclic hydrocarbon is from 50 to 200 mass % based on the mass of the (I) polysiloxane.

2. The composition according to claim 1, wherein said polysiloxane has silanol at the terminal or in the side chain.

3. The composition according to claim 1, wherein said $R^1$ is hydrogen, a linear, branched or cyclic $C_{1-6}$ alkyl or a $C_{6-10}$ aryl.

4. The composition according to claim 1, wherein said polysiloxane comprises repeating units selected from the group consisting of (i-1), (i-2) and (i-3) in combination:

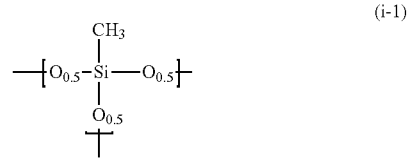

(i-1)

(i-2)

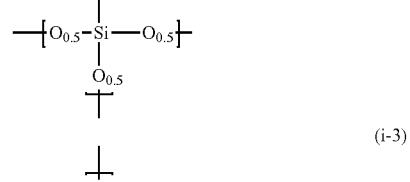

(i-3)

provided that the mixing molar ratios p1, p2 and p3 of (i-1), (i-2) and (i-3), respectively, satisfy the conditions of:

$0.4 \leq p1/(p1+p2+p3) \leq 0.8$, $0 \leq p2/(p1+p2+p3) \leq 0.4$, and $0.2 \leq p3/(p1+p2+p3) \leq 0.6$.

5. The composition according to claim 1, wherein said polysiloxane has a mass average molecular weight of 1,000 to 10,000 measured by gel permeation chromatography in terms of polystyrene.

6. The composition according to claim 1, wherein said polysiloxane contains the repeating unit (Ib) in a mixing ratio of 20 mol % or more based on the total amount of the repeating units.

7. The composition according to claim 1, wherein said polysiloxane further contains a repeating unit represented by the following formula (Ic):

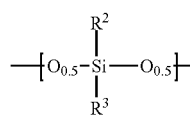
(Ic)

wherein

R² and R³ are independently hydrogen, linear, branched or cyclic $C_{1-6}$ aliphatic hydrocarbon group or $C_{6-10}$ aromatic hydrocarbon group.

8. The composition according to claim 1, wherein said polysiloxane further contains a terminal unit represented by the following formula (Id):

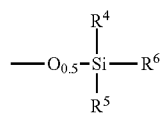
(Id)

wherein

R⁴ to R⁶ are independently hydrogen, linear, branched or cyclic $C_{1-6}$ aliphatic hydrocarbon group or $C_{6-10}$ aromatic hydrocarbon group.

9. The composition according to claim 1, wherein said condensation catalyst generator is a thermal base generator or a photobase generator.

10. The composition according to claim 1, wherein said thermal base generator is at least one compound selected from the group consisting of 1,8-diazabicyclo[5.4.0]undec-7-ene tetraphenylborate, 1,8-diazabicyclo[5.4.0]undec-7-ene triphenylbutylborate, 1,8-diazabicyclo[5.4.0]undec-7-ene tetrabutylborate, 1,8-diazabicyclo[5.4.0]undec-7-ene fumaric acid salt, 1,5-diazabicyclo-[4.3.0]non-5-ene tetraphenylborate, 1,5-diazabicyclo-[4.3.0]non-5-ene triphenylbutylborate, 1,5-diazabicyclo-[4.3.0]non-5-ene tetrabutylborate, 1,5-diazabicyclo-[4.3.0]non-5-ene fumaric acid salt, 1,5-diazabicyclo[4.4.0]decene-5-ene tetraphenylborate, 1,5-diazabicyclo[4.4.0]decene-5-ene triphenylbutylborate, 1,5-diazabicyclo[4.4.0]decene-5-ene tetrabutylborate, 1,5-diazabicyclo[4.4.0]decene-5-ene fumaric acid salt, 2-Ethyl-4-methyl imidazolium tetraphenylborate, 2-Ethyl-4-methyl imidazolium triphenylbutylborate, 2-Ethyl-4-methyl imidazolium tetrabutylborate, 2-Ethyl-4-methyl imidazolium fumaric acid salt, N-(2-nitrobenzyloxycarbonyl)imidazolium triphenylbutylborate, N-(2-nitrobenzyloxycarbonyl) imidazolium tetraphenylborate, N-(2-nitrobenzyloxycarbonyl)imidazolium tetrabutylborate, and N-(2-nitrobenzyloxycarbonyl)imidazolium fumaric acid salt.

11. The composition according to claim 1, wherein said photobase generator is at least one compound represented by formula (IIIc):

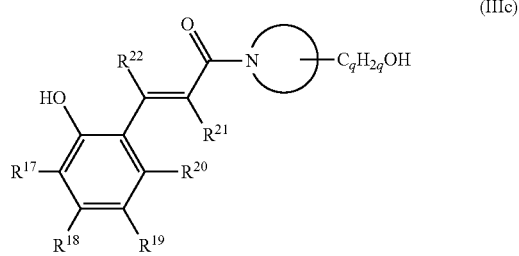
(IIIc)

wherein, q is an integer of 1 to 6;

R¹⁷ to R²² are each independently hydrogen, halogen, hydroxyl, mercapto, sulfide, silyl, silanol, nitro, nitroso, sulfino, sulfo, sulfonate, phosphino, phosphinyl, phosphono, phosphonate, amino, ammonium, $C_{1-20}$ aliphatic hydrocarbyl, which may contain a substituent, $C_{6-22}$ aromatic hydrocarbyl, which may contain a substituent, $C_{1-20}$ alkoxy, which may contain a substituent, or $C_{6-20}$ aryloxy, which may contain a substituent; and two or more of R¹⁷ to R²⁰ may be bonded to form cyclic structure(s), said cyclic structure may contain hetero atom(s), N is a constituent atom of a nitrogen-containing heterocyclic ring, said nitrogen-containing heterocyclic ring is a 3- to 10-membered ring, and said nitrogen-containing heterocyclic ring may further have $C_{1-20}$ aliphatic hydrocarbyl, which are different from $C_qH_{2q}OH$ group and may contain substituent.

12. The composition according to claim 1, wherein the amount of said condensation catalyst generator is 0.1 to 5.0 mass % based on the mass of the (I) polysiloxane.

13. The composition according to claim 1, wherein said substituted or unsubstituted polycyclic hydrocarbon is a bicyclic compound.

14. The composition according to claim 1, wherein said substituted or unsubstituted polycyclic hydrocarbon is a tricyclic compound.

15. The composition according to claim 1, wherein said substituted or unsubstituted polycyclic hydrocarbon is a hexacyclic compound.

16. The composition according to claim 1, wherein the solid content is 2.0 to 50 mass % based on the total mass of the composition.

17. A method for producing a low dielectric constant siliceous film with dispersed pores comprising: forming a coating above a substrate with the composition according to claim 1 and curing the coating.

18. The method for producing a low dielectric constant siliceous film according to claim 17, wherein further step of photo-irradiation is carried out on the formed coating prior to the curing.

19. The method for producing a low dielectric constant siliceous film with dispersed pores according to claim 17, wherein the curing is carried out at a temperature of 250° C. or below.

20. The method for producing a low dielectric constant siliceous film with dispersed pores according to claim 17, wherein said low dielectric constant siliceous film with dispersed pores has a thickness of 100 nm or more.

21. A low dielectric constant siliceous film with dispersed pores obtainable by the method according to claim 17.

22. A method for producing an electronic device, wherein the device comprising a low dielectric constant siliceous film with dispersed pores produced by the method according to claim 17.

* * * * *